United States Patent
Nekarda et al.

(10) Patent No.: US 10,644,189 B2
(45) Date of Patent: May 5, 2020

(54) METHOD AND DEVICE FOR STABILIZING A PHOTOVOLTAIC SILICON SOLAR CELL

(71) Applicant: Fraunhofer-Gesellschaft zur Forderung der angewandten Forschung e.V., Munich (DE)

(72) Inventors: Jan Nekarda, Gundelfingen (DE); Andreas Brand, Freiburg (DE); Stefan Rein, Denzlingen (DE); Fabian Fertig, Freiburg (DE); Karin Krauss, Freiburg (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 0 days.

(21) Appl. No.: 15/755,778

(22) PCT Filed: Aug. 25, 2016

(86) PCT No.: PCT/EP2016/070039
§ 371 (c)(1),
(2) Date: Feb. 27, 2018

(87) PCT Pub. No.: WO2017/032820
PCT Pub. Date: Mar. 2, 2017

(65) Prior Publication Data
US 2019/0027632 A1    Jan. 24, 2019

(30) Foreign Application Priority Data
Aug. 27, 2015 (DE) .................. 10 2015 114 298

(51) Int. Cl.
H01L 31/18 (2006.01)
H01L 31/0376 (2006.01)
H01L 21/66 (2006.01)

(52) U.S. Cl.
CPC ............ H01L 31/186 (2013.01); H01L 22/26 (2013.01); H01L 31/03767 (2013.01); H01L 31/1864 (2013.01); *Y02E 10/50* (2013.01); *Y02P 70/521* (2015.11)

(58) Field of Classification Search
None
See application file for complete search history.

(56) References Cited

U.S. PATENT DOCUMENTS

2015/0236190 A1    8/2015    Dubois et al.
2016/0141445 A1    5/2016    Herguth et al.

FOREIGN PATENT DOCUMENTS

| DE | 102009059300 | 6/2011 |
| EP | 2164114 | 3/2010 |
| WO | 2007107351 | 9/2007 |
| WO | 2014206504 | 12/2014 |

*Primary Examiner* — Alexander G Ghyka
(74) *Attorney, Agent, or Firm* — Volpe and Koenig, P.C.

(57) ABSTRACT

The invention relates to a method for stabilizing a photovoltaic silicon solar cell, including a regeneration step in which a semiconductor substrate of the solar cell which are heated to at least 50° C. is injected with charge carriers. The invention is characterized in that a degradation step is carried out before the regeneration step, wherein the solar cell is subjected to radiation, in particular laser radiation, having an illumination intensity of at least 5.000 W/m2 and the solar cell is simultaneously cooled. The invention also relates to a device for stabilizing a photovoltaic silicon solar cell.

13 Claims, 4 Drawing Sheets

METHOD AND DEVICE FOR STABILIZING A PHOTOVOLTAIC SILICON SOLAR CELL

BACKGROUND

The invention relates to a method for stabilizing a photovoltaic silicon solar cell and to a device for stabilizing a photovoltaic silicon solar cell.

Photovoltaic silicon solar cells serve for converting the energy of incident radiation into electrical energy. One crucial parameter for the economic viability of such solar cells is the efficiency, in particular, which is considerably dependent on the material quality and thus in particular on a recombination activity with regard to the generated charge carriers. Furthermore, the material costs make up a considerable proportion of the total costs of typical silicon solar cells, such that there is a need for cost-effective materials which nevertheless enable a high quality and in particular high charge carrier lifetimes. Particularly in the case of solar cells based on crystalline silicon substrates, however, degradation effects are established, i.e. the quality of the material used decreases in the course of use of the solar cell.

Therefore, there is a need for methods which stabilize such solar cells in a regenerated state with a high quality, such that no or only significantly reduced degradation takes place during use. Since the costs of the production method and thus in particular the required process time also significantly influence the total costs, there is furthermore a need to accelerate such methods.

Figure 1:
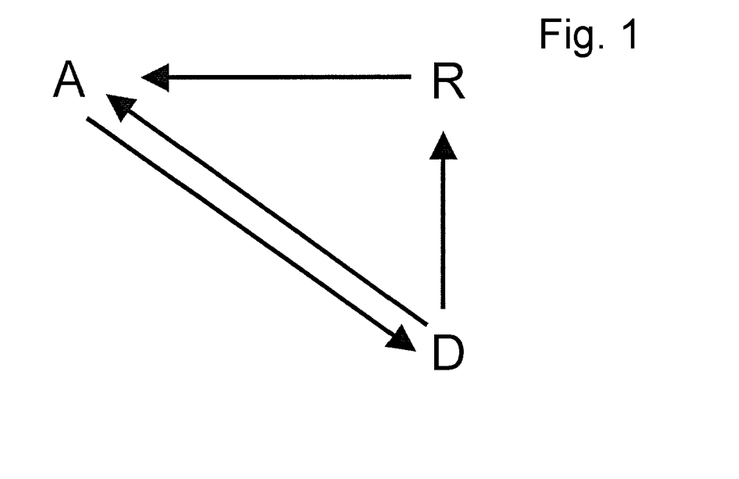
FIG. 1 shows the three-state model for the states degenerated (D), regenerated (R) and annealed (A), as already explained above.

A degradation behavior as described above was particularly pronounced in connection with boron-oxygen based defects in the semiconductor substrate of the silicon solar cell. By way of thermal treatment and typically a passivation using hydrogen, it was possible to demonstrate methods enabling such solar cells to be stabilized:

An explanatory model here is the—state model shown in FIG. 1. This takes as a basis an annealed state A, in which the solar cell, although it has a high quality, degrades during use due to being subjected to radiation, typically sunlight. In a degraded state D, the solar cell, although stable, has a significantly reduced efficiency. The aim is to obtain a regenerated state R, which is stable under typical use conditions and has an improved efficiency by comparison with the state D.

According to current knowledge, the annealed and degraded states are reversible. Under unfavorable conditions a transition from a regenerated state into the annealed state can take place, but not a direct transition into the degraded state. Furthermore, FIG. 1 makes it clear with the aid of the arrows that a direct transition from an annealed state into a regenerated state is not possible, rather a path via a degraded state must be chosen.

These effects were observed in particular with the use of Czochralski (Cz) silicon. Such effects or comparable effects likewise appear to occur in the case of multicrystalline silicon wafers as well.

Methods for stabilizing a photovoltaic silicon solar cell as described above are known from WO 2014/206504 A1, EP 1 997 157 B1 and EP 2 164 114 B1.

SUMMARY

The present invention is based on the object of providing a method and a device for stabilizing a photovoltaic silicon solar cell in order to enable the silicon solar cell to be stabilized in a manner less susceptible to faults and/or in an accelerated manner.

This object is achieved by a method and a device having one or more features of the invention. Advantageous configurations of the method according to the invention and of the device according to the invention are found below and in the claims.

The method according to the invention is preferably configured for being carried out by the device according to the invention, in particular an advantageous embodiment thereof. The device according to the invention is preferably configured for carrying out the method according to the invention, in particular an advantageous embodiment thereof.

The method according to the invention for stabilizing a photovoltaic silicon solar cell comprises a regeneration step, wherein charge carriers are injected in a semiconductor substrate of the solar cell, which is heated to at least 50° C. Such a regeneration step is known from the prior art.

The invention is based on the insight, in particular, that the extent of degradation of the solar cell before regeneration makes up a considerable proportion of the reliability and the total duration of the stabilization process. A preceding degradation before a regeneration is thus accorded a two-fold importance: firstly, for the overall quality of the stabilization process it is crucial that, before the regeneration step, the affected material has as far as possible no or only negligibly small portions in the annealed state. This is because, as explained above, a direct transition from the annealed state into the regenerated state is not possible. What is more, however, the degradation process constitutes a process that is just as time-consuming or even more time-consuming than the regeneration process. The present invention is thus based on the insight that a method and a device for stabilizing a photovoltaic silicon solar cell can be considerably improved by increasing the insusceptibility to faults and/or reducing the process duration of the degradation step. In this regard, the invention is furthermore based on the insight that a particularly advantageous improvement of the degradation step is obtained by obtaining a high generation rate of charge carriers in the solar cell by irradiation and at the same time avoiding an excessively high temperature of the solar cell.

The method according to the invention therefore comprises a degradation step, which is carried out before the regeneration step, wherein the solar cell is subjected to laser radiation having an irradiation intensity of at least 5,000 W/m² (5 kW/m²) and at the same time the solar cell is actively cooled.

Particularly the combination of the generation of a greatly increased charge carrier density of free charge carriers due to acting on the solar cell with the abovementioned high irradiation intensity with the active cooling thus enables a degradation step which firstly is comparatively rapid and which additionally ensures a substantial or virtually complete conversion of the material regions of the solar cell in the annealed state into the degraded state. The active cooling here affords two different advantages: firstly, the solar cell is prevented from undergoing severe heating due to the high irradiation intensity. Furthermore, in typical processes for producing a photovoltaic silicon solar cell the stabilization step is preceded by processing steps which entail a temperature influence and thus heating of the solar cell. The active cooling thus furthermore leads to an acceleration of the method by virtue of the fact that, for the degradation step, even in the event of preceding heating in the production method, the solar cell can be brought rapidly into the state of a reduced temperature by the active cooling.

Thus, firstly, due to the high irradiation intensity, in the case of which excessively great heating is simultaneously avoided due to the active cooling, the method according to the invention enables a high quality in the sense of a complete or at least almost complete elimination of material regions in the annealed state and a considerable acceleration of the method and thus also reduction of costs in the stabilization process.

Excessively great heating of the solar cell has the disadvantage that the solar cell can be adversely affected or even damaged; in particular, metallic contacting structures and their electrical and mechanical connection to semiconductor layers may be adversely affected, as may the electronic quality of the semiconductor materials, in particular the minority charge carrier lifetimes or the electrical passivation quality of surfaces of the semiconductor layers. Furthermore, it is advantageous to obtain the degradation state as far as possible purely by heating and at the same time with a free charge carrier density that is not greatly increased. By exactly stipulating the temperature to which the solar cell is heated, and at least complying with an upper limit of temperature, a disadvantageously high charge carrier density is avoided.

Due to the active cooling, which avoids the disadvantages of excessively great heating, the possibility of using very high irradiation intensities for the degradation of the solar cell is furthermore afforded. It is therefore advantageous in the degradation step to subject the solar cell to laser radiation having an irradiation intensity of at least 10,000 $W/m^2$, in particular at least 50,000 $W/m^2$, preferably at least 100,000 $W/m^2$, more particularly preferably at least 500,000 $W/m^2$, and at the same time to actively cool the solar cell.

Such high light intensities over a comparatively short time period can in particular advantageously be generated by the use of lasers. Lasers have the advantage that, in terms of apparatus, comparatively low evolution of heat takes place compared with other radiation sources such as xenon or halogen lamps, for example, and furthermore, it is possible for the laser radiation to be switched on and off rapidly over a large number of cycles. Diode lasers are particularly suitable for this purpose.

The advantageous effects mentioned above are achieved in a special way and the disadvantageous effects of excessively great heating are avoided by virtue of the fact that, in one preferred embodiment, in the degradation step the solar cell does not exceed an upper temperature limit of 100° C., in particular of 70° C., preferably of 60° C., more particularly preferably of 50° C., more preferably of 40° C., in particular preferably supported by an active cooling of the solar cell, preferably during the degradation step.

An excessively high temperature entails the risk, in particular, of the formation rate for the annealed state being dominant over the other processes. Therefore, an excessively high temperature, in particular greater than 100° C., is advantageously avoided.

Even at a temperature of less than 100° C. a considerable improvement should be expected since, at such a temperature, no regeneration takes place or regeneration takes place only slightly and this precludes a situation in which a degenerated region is regenerated and subsequently attains the annealed state.

Furthermore, the combination of a high irradiation intensity with a reduced temperature is advantageous for a dominant degradation. In the case of typical materials, in particular in the case of Cz silicon, it is therefore particularly advantageous to choose a temperature of less than 70° C., more preferably less than 60° C. Particularly at temperatures of less than 50° C. and more preferably less than 40° C. for a dominant degeneration process.

In order to avoid an excessively high temperature, it is advantageous that the temperature of the solar cell is measured, preferably by an optical temperature measurement, and that the irradiation intensity and/or an active cooling are/is chosen in such a way that the temperature of the solar cell does not exceed a predefined maximum temperature, in particular lies in a predefined temperature range.

Controlling the solar cell temperature by temperature measurement of the temperature of the solar cell and, depending on the measured temperature, changing the irradiation intensity and/or the cooling power with which the solar cell is cooled makes it possible reliably to avoid excessively high temperatures. Particularly the use of non-contact, preferably optical, temperature measurements is advantageous here in order to preclude additional fault sources. Furthermore, in particular the use of monochromatic radiation in the visible spectrum, preferably laser radiation, is advantageous here since, as a result, there is no influencing of an optical temperature measurement in the heat spectrum. Furthermore, in particular the use of lasers for generating the radiation is advantageous here since the power of lasers can be controlled very rapidly and exactly by comparison with other light sources and it is thus possible for the temperature of the solar cell to be controlled very rapidly and accurately.

The combination of the degradation by irradiation with high intensity with active cooling at the same time enables, as described above, an advantageously short time duration of the degradation step. Advantageously, therefore, the degradation step is carried out for a time duration in the range of 0.1 s to 20 s, preferably in the range of 0.1 s to 5 s. This results, in particular, in cost savings due to the reduced total duration of the stabilization process.

Subjecting the solar cell to radiation having a high radiation intensity of at least 5,000 $W/m^2$ brings about a high generation rate of electron-hole pairs in the silicon solar cell. In this case, the use of broadband radiation lies within the scope of the invention, in particular the use of broadband light sources such as, for example, halogen or xenon lamps. It likewise lies within the scope of the invention for the radiation to be a monochromatic radiation. This is particularly advantageous since a high generation of electron-hole pairs in conjunction with comparatively low heating can be achieved by monochromatic radiation. Therefore, particularly the use of lasers is advantageous. For a high efficiency with regard to the generation of electron-hole pairs in the silicon solar cell, the use of radiation having a spectrum having high absorption in the semiconductor substrate of the solar cell is advantageous. In particular, the spectrum of the radiation used in the degradation step is advantageously in the wavelength range of 300 nm to 1,200 nm, preferably 600 nm to 1,000 nm. For a given semiconductor material, therefore a spectrum which lies above and near the band edge of the semiconductor material is particularly advantageous. This results in an efficient generation of electron-hole pairs in conjunction with minimized heating.

Investigations have furthermore shown that a significant acceleration of the regeneration process, too, is possible by high radiation intensities. The scientific prejudice hitherto was that, proceeding from an illuminance of approximately 1,000 $W/m^2$ (1 $kW/m^2$), further acceleration of the regeneration process does not occur as the illumination intensity increases. The investigations revealed, however, that an advantageously short total process duration can be obtained at considerably higher intensities in the corresponding temperature regime.

In one advantageous embodiment, the regeneration step is carried out in conjunction with active cooling of the solar cell to a temperature of less than 250° C., preferably less than 230° C., and subjecting the solar cell to a radiation intensity of at least 10,000 W/m$^2$ (10 kW/m$^2$). Advantageously short total process durations can be achieved as a result. In particular, it is advantageous that in the case of the parameters mentioned above, the total process duration of degradation step and regeneration step is less than 50 s. It is particularly advantageous here to cool the solar cell to a temperature in the range of 150° C. to 250° C., in particular of 200° C. to 250° C., during the regeneration step.

The investigations have furthermore shown, however, that far higher illuminances are advantageous in order to achieve a regeneration with a high quality, and that with these illuminances considerably higher temperatures are not disadvantageous, but the solar cell should not exceed a maximum temperature of 400° C. In one advantageous configuration, therefore, during the regeneration step the solar cell is actively cooled to a temperature in the range of 250° C. to 400° C., in particular 300° C. to 400° C., and the solar cell is subjected to a radiation intensity of at least 10,000 W/m$^2$, preferably at least 50,000 W/m$^2$, in particular at least 70,000 W/m$^2$. A high regeneration quality in conjunction with a short total process duration can be achieved as a result. Advantageously, in the case of the parameters mentioned above, the total process duration of degradation step and regeneration step is less than 50 s.

The advantages of the present invention reside in particular in a substantial or preferably complete degradation of annealed states of the solar cell in conjunction with a short process duration of the degradation step. It is therefore particularly advantageous to avoid negative influences on the degradation process that can ensue from a regeneration process. Advantageously, therefore, the regeneration step is carried out after the conclusion of the degradation step. Consequently, two separate temporally successive process steps are involved; that is to say that the degradation is dominant in a first process step and the regeneration is dominant in a second, later process step. In this case, it lies within the scope of the invention to interpose one or more intermediate steps between degradation step and regeneration step. Preferably, however, in order to avoid disturbances that may lead to a return to annealed states, the regeneration step is carried out directly after the conclusion of the degradation step.

In this case, it lies within the scope of the invention for degradation and regeneration to be carried out only in one or a plurality of partial regions of the solar cell. In this case, it is advantageous for a degradation and regeneration to be carried out progressively in a plurality of partial regions, such that the totality of the partial regions substantially or preferably completely covers the silicon solar cell. In particular, an embodiment of the method that is advantageous with regard to the structural requirements made of the device used is one in which in a strip-like region, which preferably completely covers a width of the solar cell, a degradation firstly takes place at a first region and a regeneration takes place at a subsequent region, wherein the strip-like region is moved relative to the solar cell. As a result, an advantageous continuous method can thus be realized in which, for example, the solar cell under a first region, in which an irradiation with an intensity as described above with active cooling at the same time is effected in order to form the degradation step and a regeneration is effected in a subsequent region at a higher temperature and advantageously with exposure to radiation.

It is therefore advantageous for the degradation region to be moved relative to the solar cell, and/or for the solar cell to be irradiated progressively in a plurality of spatially different degradation regions, i.e. to be subjected to degradation radiation.

In particular, it is advantageous that, in an initial region, in which the degradation region covers a first edge of the solar cell, the irradiation is carried out with an initial intensity, and that, in an end region, in which the degradation region, after the irradiation of the initial region, covers a second edge, in particular an opposite edge with respect to the first edge, of the solar cell, the irradiation is carried out with an end intensity lower than the initial intensity. More preferably, in a central region, in which the degradation region, after the irradiation of the initial region and before the irradiation of the end region, covers a central region of the solar cell, an irradiation is advantageously carried out with a medium intensity, which is less than the initial intensity and greater than the end intensity.

This is owing to the fact that due to the thermal mass of the solar cell and, if appropriate, further elements thermally connected to the solar cell, during the irradiation of only a partial region of the solar cell, firstly it is possible to achieve heating to the desired temperature in an accelerated form with a higher energy input and correspondingly a higher initial intensity. Following this process it is possible to maintain a constant intensity in particular by using a lower medium intensity relative to the initial intensity, i.e. a comparatively lower energy input. If the degradation region moves toward only an end region with a second edge, in particular an opposite edge relative to the first edge, of the solar cell, then the thermal mass of the partial region of the solar cell that is still to be heated decreases, such that an even lower intensity with a correspondingly even lower energy input is preferably used in said end region.

As a result, a constant temperature that is as homogeneous as possible is achieved over the entire volume and in particular the entire area of the solar cell and the requirement made of the accuracy of the active cooling is thus advantageously reduced.

In the case of a constant temperature ensured by the active cooling, however, it is also possible for movement of the degradation region to be effected as described above without a change in the intensity. This is possible particularly advantageously by the solar cell being coupled to a larger thermal mass having the desired temperature by active cooling. By way of example, the use of a treatment block on which the solar cell bears over a large area in order to form a high thermal coupling, preferably over the whole area by a rear side, is advantageous. In an uncomplicated manner in terms of apparatus, the above-mentioned block can be brought to a desired temperature range by active cooling.

If the degradation is effected with a degradation region extending at least over a width of the solar cell, the degradation region can have a homogeneous irradiation intensity at least orthogonally with respect to a displacement direction of the degradation region. In particular, the degradation region can have a homogeneous irradiation intensity over the whole area.

It is advantageous that, in the degradation step, the irradiation is carried out in a degradation region, wherein at the edges of the solar cell the irradiation is carried out with a lower edge intensity, relative to a central-region intensity with which regions at a distance from the edges are irradiated. As above, this is likewise due to the lower thermal coupling of the edge regions to surrounding solar cell regions compared with central regions of the solar cell.

In a further advantageous configuration, the solar cell is subjected to the degradation radiation over the whole area during the degradation step. This ensures a homogeneous degradation in particular in a structurally simple manner.

Typically, regeneration steps advantageously take place at significantly increased temperatures with respect to room temperature. It is thus particularly advantageous for the solar cell to have a higher temperature during the regeneration step compared with the degradation step, in particular advantageously a temperature that is higher by at least 50° C., more particularly preferably by at least 100° C., more preferably by at least 200° C., compared with the temperature during the degradation step.

Advantageously, as described above, the solar cell is subjected to radiation during the regeneration step as well. In this case, typically, as described above, a higher temperature of the solar cell compared with the degradation step is advantageous. Nevertheless, in an advantageous manner, the solar cell is actively cooled during the regeneration step as well. This is due to the fact that an acceleration of the regeneration step can be achieved by an irradiation with high intensity being effected. However, such an irradiation can lead to excessively great, i.e. undesirably high, heating of the solar cell, such that by virtue of active cooling during the regeneration step, the use of high intensities of the radiation is possible during the regeneration as well. For an efficient regeneration, advantageously in the regeneration step the solar cell is brought to a temperature in the range of 200° C. to 500° C., more particularly preferably greater than 250° C. to 500° C., more particularly preferably 300° C. to 500° C. In particular, it is advantageous to achieve the abovementioned temperature ranges of the solar cell in the regeneration step by active cooling.

In order to achieve a short total process duration, it is advantageous for the regeneration step to be carried out for a regeneration duration T of less than 3 s, preferably less than 0.5 s. This is supported particularly advantageously by the solar cell being subjected to high light intensity, advantageously greater than 10 kW/m$^2$, in particular greater than 50 kW/m$^2$, preferably greater than 100 kW/m$^2$, with active cooling at the same time.

The object on which the invention is based is furthermore achieved by a device having one or more features of the invention.

The device for stabilizing a photovoltaic silicon solar cell comprises a regeneration radiation source for subjecting the solar cell to regeneration radiation. What is essential is that the device comprises a degradation radiation source for subjecting the solar cell to degradation radiation and an active cooling unit for actively cooling the solar cell.

The degradation radiation source is configured to subject the solar cell to degradation radiation having an intensity of at least 5,000 W/m$^2$. Degradation radiation source and cooling unit are arranged and configured cooperatively in such a way that the solar cell is able to be subjected to the degradation radiation and is able to be cooled actively simultaneously.

This affords the advantages already mentioned in the case of the method according to the invention; in particular, it is possible to carry out an extensive, advantageously complete, conversion of the annealed states into degradation states in a shorter time compared with previously known methods.

As already described above, the degradation radiation source is advantageously configured as a laser radiation source since high light intensities can advantageously be generated for a short time duration by a laser. In particular, the use of laser diodes is advantageous in this case. Typically, a planar region, which preferably completely covers at least a width of the solar cell, is illuminated during the degradation step. In particular, it is advantageous for the solar cell to be completely subjected to radiation during the degradation step. Therefore, the use of a plurality of laser diodes, in particular a plurality of laser diodes arranged in a matrix form, is advantageous in order to achieve a large-area, homogeneous illumination with high intensity.

As described above, a measurement of the solar cell temperature and, depending thereon, a control of the radiation power of the degradation radiation source and/or of the cooling power of a cooling unit for cooling the solar cell are advantageous. It is thus particularly advantageous that the device comprises a temperature measuring unit for measuring the temperature of the solar cell, in particular an optical temperature measuring unit, preferably that the device comprises a control unit, which is configured to cooperate with the degradation radiation source and/or a cooling unit in order to achieve a temperature of the solar cell in a predefined temperature range.

Particularly efficient cooling of the solar cell is achieved by virtue of the fact that, in one advantageous configuration of the device, the cooling unit comprises an actively cooled mount for the solar cell, in particular for the planar arrangement of one side of the solar cell on the mount. This results in a good thermal contact between solar cell and mount. Solar cells typically have a large width/thickness ratio. Typical solar cells have side lengths of greater than 10 cm and thicknesses of less than 500 μm. Upon such a solar cell being placed onto such a mount by one side, preferably by the rear side of the solar cell, this therefore results in a very good thermal coupling to the mount. The mount preferably has a large thermal mass; in particular, the at least partial or preferably complete embodiment of the mount from metal is advantageous. The active cooling can be effected for example by a cooling liquid being fed to cooling lines at/in the mount.

In a further advantageous embodiment, the cooling unit comprises at least one active fan for feeding a cooling fluid to the solar cell, in particular for blowing a cooling gas, for example air or a purified gas, for example argon, at the solar cell. Active cooling of the solar cell can thereby be effected in a simple manner, independently of the mount or transport mechanism used for the solar cell in the device.

Advantageously efficient active cooling is achieved by conducting a cooling liquid onto a surface of the solar cell. The liquid can thereby be applied to the solar cell particularly advantageously in the form of drops, particularly preferably in the form of mist. In one advantageous embodiment, the cooling unit thus comprises feed means for feeding a cooling fluid on at least one surface of the solar cell, particularly preferably means for spraying the cooling liquid onto the solar cell.

Degradation radiation source and regeneration radiation source are advantageously configured as two separate radiation sources. In particular, the degradation radiation source and regeneration radiation source are advantageously configured and arranged in the device in such a way that degradation radiation source and regeneration radiation source subject the solar cell to radiation at different locations.

What can thereby be achieved in a particularly efficient manner is that the degradation step is firstly concluded before a regeneration takes place.

In a further advantageous embodiment, degradation radiation source and regeneration radiation source are configured as a unified degradation and regeneration radiation source. Furthermore, the device is configured in such a way that the degradation and regeneration radiation source acts on the solar cell in only a partial region of the solar cell surface, which partial region preferably covers an entire width of the solar cell. For this purpose, the device preferably comprises a conveying unit, for conveying the solar cell relative to the degradation radiation source.

In this advantageous embodiment, therefore, a degradation region is moved relative to the solar cell and regeneration and degradation are furthermore achieved by one radiation source, which is thus both degradation radiation source and regeneration radiation source.

Advantageously, the cooling unit in this case is configured in such a way that partial cooling of the solar cell is possible in order to achieve a lower temperature in the region of the degradation, compared with the temperature in the region of the regeneration.

BRIEF DESCRIPTION OF THE DRAWINGS

Further preferred features and embodiments are explained below with reference to exemplary embodiments and the figures, in which.

DETAILED DESCRIPTION OF THE PREFERRED EMBODIMENTS

All of the figures show schematic illustrations that are not true to scale. In the figures, identical reference signs designate identical or identically acting elements.

Figure 2:
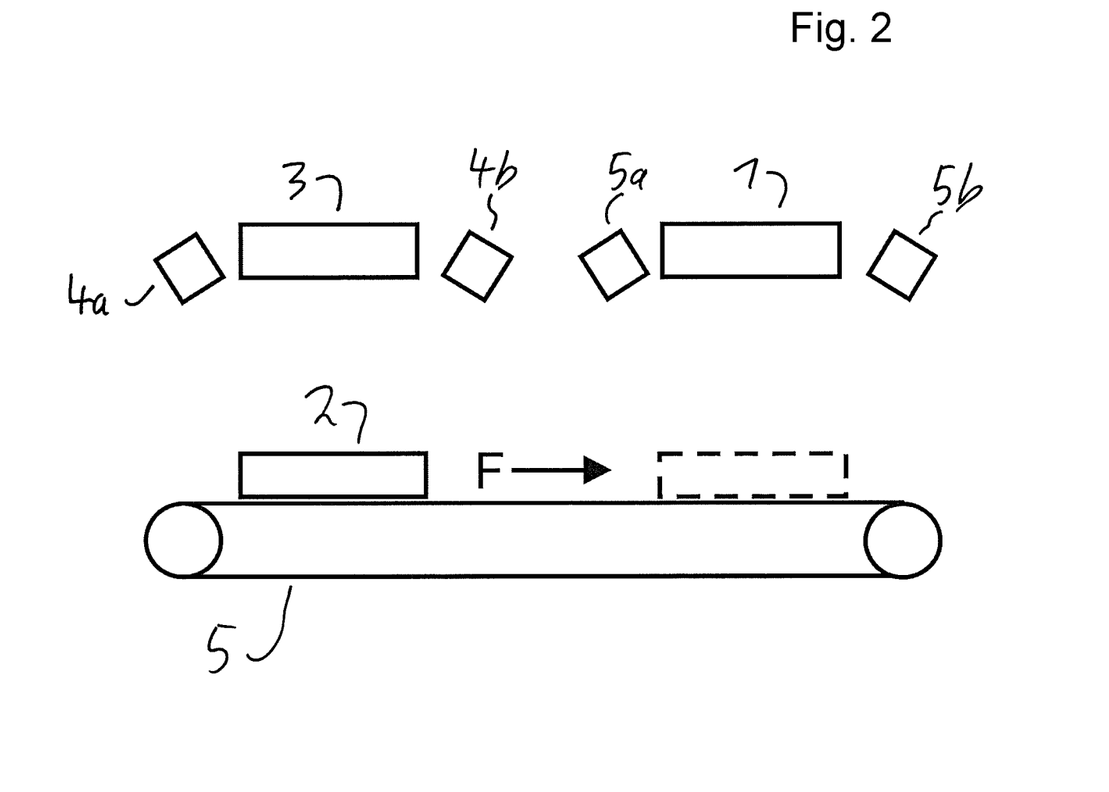
FIG. 2 shows a first exemplary embodiment of a device according to the invention comprising a degradation radiation source and a separate regeneration radiation source.

FIG. 2 illustrates a first exemplary embodiment of a device for stabilizing a photovoltaic silicon solar cell. The device comprises a regeneration radiation source 1 for subjecting a silicon solar cell 2 that is to be stabilized to regeneration radiation.

Furthermore, the device comprises a degradation radiation source 3 for subjecting the solar cell 2 to degradation radiation, and also an active cooling unit 4, which in the present case is configured in a manner comprising two fans 4a and 4b.

The degradation radiation source 3 and the fans 4a and 4b are arranged and configured cooperatively in such a way that the solar cell 2 in the degradation position illustrated in FIG. 2 is able to be subjected to the degradation radiation and is able to be cooled simultaneously.

The device in accordance with FIG. 2 furthermore comprises a conveyor belt 5, in order to convey the solar cell 2 into the degradation position illustrated and a regeneration position illustrated by dashed lines.

Furthermore, additional fans 5a and 5b are provided such that it is possible for the solar cell to be actively cooled by blowing during the regeneration process as well.

The device in accordance with FIG. 2 enables, in particular, a reliable and at the same time shorter stabilization method compared with previously known methods, since, in the regeneration position of the silicon solar cell 2 illustrated in FIG. 2, by use of the degradation radiation source 3 the solar cell is able to be subjected to high light intensity and it is ensured at the same time by the fans 4a and 4b due to the active cooling that a predefined maximum temperature of the silicon solar cell 2 is not exceeded.

In the present case, the degradation radiation source is configured as a matrix of diode lasers comprising 30 lasers per rows, with 30 rows, which generate light in the wavelength range of 850 nm. Light in the wavelength range of 808 nm or 980 nm can likewise be used. Matrices of diode lasers having a different number of lasers per row and number of columns can likewise be used. It is likewise possible to use just one laser, the output beam of which is correspondingly spatially expanded and homogenized with regard to the intensity by optical means. At the surface of the silicon solar cell, in the degradation step, light having an intensity of 50,000 W/m$^2$ is generated by the degradation radiation source 3. At the same time, ambient air is blown at the solar cell by the fans 4a and 4b, such that the solar cell does not exceed a temperature of 60° C.

A rapid and reliable degradation is ensured as a result. In particular, a regeneration is precluded or at least considerably reduced due to the comparatively low process temperature of the solar cell. Given these process parameters, a reliable degradation can be carried out with a process time of less than 10 s.

Afterward, the solar cell is conveyed into the regeneration position illustrated by dashed lines by the conveyor belt 5. In said regeneration position, the solar cell is subjected to radiation from the regeneration radiation source 1, wherein here, too, by the fans 5a and 5b the solar cell is cooled by ambient air being blown at it, but in such a way that the solar cell has a temperature in the range of 120° C. to 250° C.

The regeneration radiation source comprises a plurality of halogen lamps for generating radiation.

Alternatively, the regeneration process can also be carried out with other set-ups, in particular as known from the prior art cited in the introduction. What is essential is that, for a reliable and at the same time rapid degradation in the degradation step, the silicon solar cell 2 is simultaneously subjected to radiation having a high intensity and actively cooled.

In an alternative set-up, instead of the fans 4a and 4b, spray nozzles for spraying a cooling liquid mist onto the silicon solar cell 2 are arranged at the degradation position. Via a cooled cooling liquid tank, cooling liquid is fed to the two spray nozzles by a pump, such that the active cooling is effected by spraying on the solar cell, such that the solar cell does not exceed a predefined temperature during the degradation step.

In a further alternative, a cooled gas, for example cooled ambient air or other types of gas, such as cooled argon gas, for example, is fed to the fans 4a and 4b, such that more efficient cooling is possible. Furthermore, it is advantageous to feed a particularly pure gas and/or purified, in particular filtered, ambient air, in particular argon gases, as described above, by the fans for cooling purposes, in order to avoid contamination of the solar cell and the process space.

Furthermore, it is advantageous for the components illustrated in FIG. 2 to be arranged in a housing.

Figure 3:
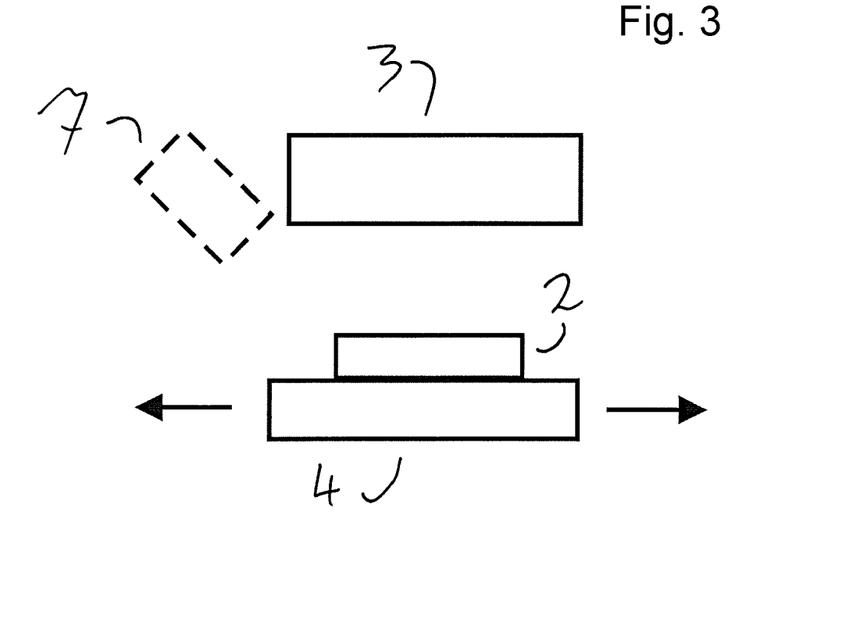
FIG. 3 shows a second exemplary embodiment of a device according to the invention comprising an actively cooled mount for a solar cell.

FIG. 3 illustrates a second exemplary embodiment of a device according to the invention. In order to avoid repetition, only the essential differences in comparison with the device in accordance with FIG. 2 are discussed:

The cooling unit 4 of the device in accordance with FIG. 3 is configured as an actively cooled mount, in the present case as a metallic block, also referred to as "chuck". This mount preferably has openings for sucking the solar cell onto the mount in a manner known per se. Furthermore, the mount has cooling lines, through which cooling liquid is pumped by a pump in order to cool the mount to a predefined temperature. In particular, the mount 4 can be embodied in accordance with or at least substantially like corresponding blocks which are configured for measuring solar cells, in particular for bright characteristic curve measurement (so-called "measurement blocks").

This exemplary embodiment has the advantage that the active cooling unit 4 has a significantly larger thermal mass compared with the silicon solar cell 2, such that the temperature of the silicon solar cell 2 corresponds to the temperature of the active cooling unit 4 in a very reliable manner the silicon solar cell 2.

In one advantageous configuration, the active cooling unit is displaceable, in particular displaceable by a motor, toward the right and left, as indicated by the arrows. As a result, in a kind of reciprocating operation, on one side a solar cell can be received, then the solar cell can be brought to the illustrated position for carrying out the process step and then be brought to an output position for example at the opposite side of the solar cell.

In one advantageous development, the device in accordance with FIG. 3 comprises an optical temperature measuring and control unit 7, illustrated by dashed lines. The temperature measuring and control unit is connected to the degradation radiation source 3 and controls the power thereof in such a way that the solar cell in the degradation step that the solar cell has a temperature in the range of 50° C. to 60° C.

In the case of the device in accordance with FIG. 3, by changing the cooling power with which the mount is cooled and/or by changing the radiation power with which the degradation radiation source 3 acts on the silicon solar cell 2, it is possible to carry out both the degradation step and, after the conclusion of the degradation step, subsequently the regeneration step. What is essential in this case, in particular, is that the degradation step is carried out at a lower temperature of the silicon solar cell compared with the temperature of the silicon solar cell 2 during the regeneration step.

It is likewise possible to use the device in accordance with FIG. 3 exclusively for the degradation step and then to carry out the regeneration in a region (not illustrated) of the device which comprises a regeneration radiation source. This has the advantage that the respective regions of the device can be optimized for the degradation step, on the one hand, and the regeneration step, on the other hand.

Figure 4:
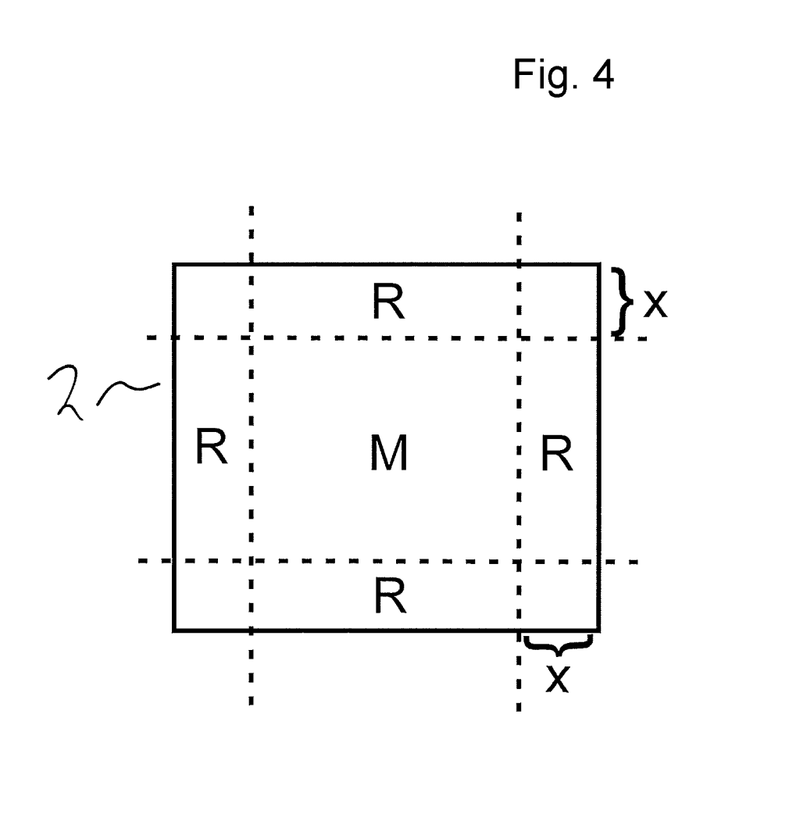
FIG. 4 shows an illustration of a solar cell being subjected to radiation, wherein the intensity decreases toward the edges of the solar cell.

It lies within the scope of the invention, for carrying out the degradation, to subject the silicon solar cell to degradation radiation over the whole area or to subject only a partial region of the solar cell to degradation radiation, wherein the partial region is advantageously displaced over the solar cell, such that as a result the entire solar cell was subjected to degradation radiation and/or a plurality of partial regions are progressively subjected to degradation radiation, such that as a result the entire solar cell was subjected to degradation radiation. Advantageous configurations thereof are explained below with reference to FIGS. 4 to 6A-6C:

FIG. 4 shows a plan view from above of a silicon solar cell 2 which is subjected to degradation radiation over the whole area. Since central regions of the solar cell are connected to correspondingly temperature-regulated regions of the solar cell toward all sides, a higher energy input is typically possible here, compared with edge regions, at which only a lower heat dissipation takes place via the edge. In order to avoid an excessively increased temperature in the edge regions of the silicon solar cell, it is therefore advantageous to subject the edge regions to a lower intensity compared with a central region. FIG. 4 illustrates by dashed lines the edge regions R at the four edges of the solar cell, which are at a distance X in the range of 0.5 cm to 5 cm, in particular a distance of approximately 1 cm from the respective edge. As described above, the degradation radiation source is advantageously configured in such a way that the silicon solar cell is subjected to a higher intensity in the central region M compared with the intensity in the edge regions R. In particular, the intensity in the edge regions is lower than in the central region M preferably by approximately 5%, more particularly preferably by approximately 10%, wherein here typically due to the heat conduction there is a fluid temperature transition between the central region M and the edge regions R, that is to say that the temperature change does not proceed in a step-like manner.

An irradiation intensity adapted in this way in accordance with FIG. 4 is particularly advantageous if the silicon solar cell is not connected to a considerably larger thermal mass, for example if the solar cell, as in the device in accordance with FIG. 1, is cooled by blowing and, in particular, if the conveyor belt, in a manner known per se, as in the case of continuous furnaces, for example, consists merely of two comparatively thin belts or cords, which thus have only a small thermal mass and exhibit little heat dissipation.

In the case of a configuration of the cooling unit in accordance with FIG. 2, i.e. with the use of a cooling block with integrated active cooling or with active cooling by feeding a cooling liquid, a thermal mass of the mount configured as a cooling block is typically higher by a multiple compared with that of the silicon solar cell, such that in this case, also owing to a very good thermal contact due to the rear side of the solar cell bearing on the mount, in particular bearing thereon substantially over the whole area, an inhomogeneous temperature distribution of the solar cell during the degradation process is not present or is present at least to a substantially smaller extent. Consequently, a homogeneous irradiation over the whole area can be used here. A structurally simple configuration is achieved as a result. In order to increase the temperature homogeneity, it is possible, of course, in this case, too, to use a spatially inhomogeneous irradiation intensity, in particular in accordance with FIG. 4.

Figure 5:
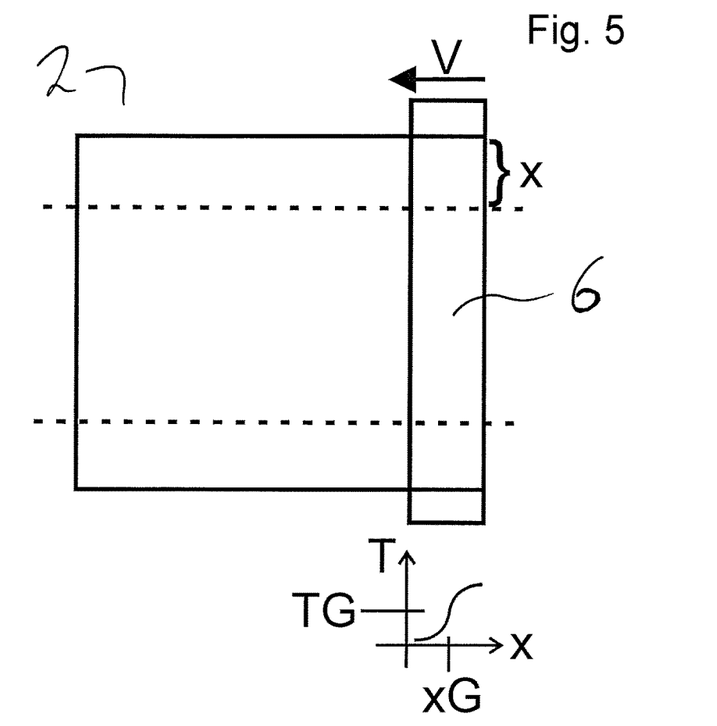
FIG. 5 shows an illustration with the solar cell being subjected to radiation, wherein the radiation is moved in a strip-shaped region across the surface of the solar cell.

In an alternative exemplary embodiment to irradiation over the whole area, in particular irradiation over the whole area in accordance with FIG. 4 during the degradation process, in a manner illustrated in FIG. 5, only a strip-like degradation region 6 of the silicon solar cell is subjected to degradation radiation, wherein the degradation region 6 is moved relative to the silicon solar cell 2 in accordance with the direction V, such that the entire surface of the silicon solar cell 2 was subjected to degradation radiation as a result. A continuous method can thereby be realized in an advantageous manner, in particular by virtue of the fact that, given a spatially fixed degradation region 6, the solar cell is moved oppositely to the direction V in FIG. 5.

In order to optimize the respective process conditions, firstly the degradation step is carried out. The regeneration is carried out in a subsequent, separate method step. This regeneration can comprise subjecting the whole area to regeneration radiation or likewise just subjecting a partial region of the solar cell to regeneration radiation, wherein the partial region is moved relative to the solar cell, such that the entire solar cell was subjected to regeneration radiation as a result.

This has the advantage that respectively optimum process conditions for degradation, on the one hand, and regeneration, on the other hand, can be predefined in a particularly reliable manner.

Figure 6A:
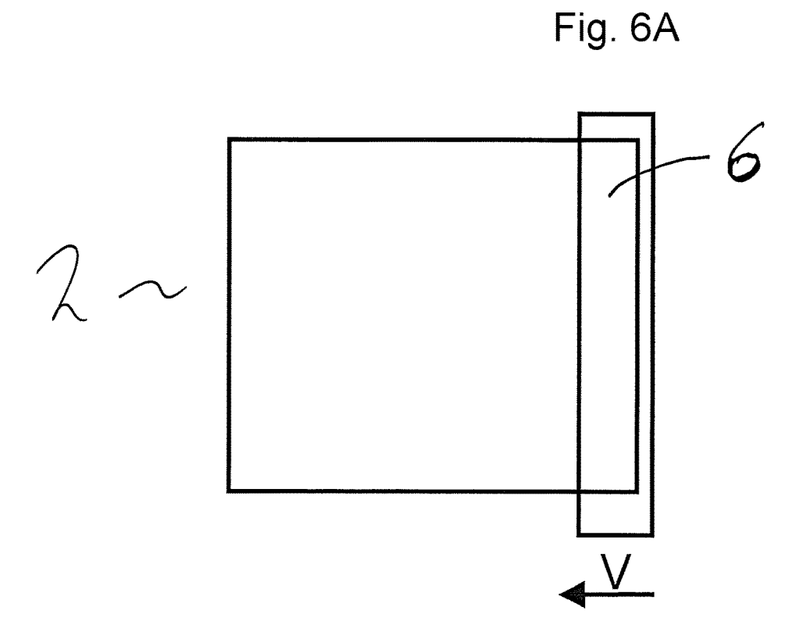
FIGS. 6A-6C show a development of the exemplary embodiment in accordance with FIG. 5 with different intensities at the beginning and at the end of the processing step.
Figure 6B:
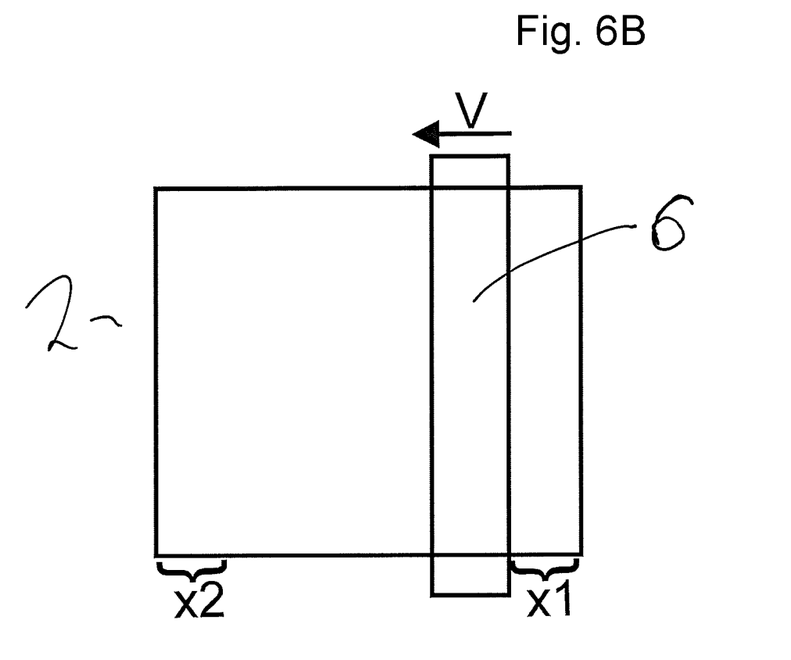
Figure 6C:
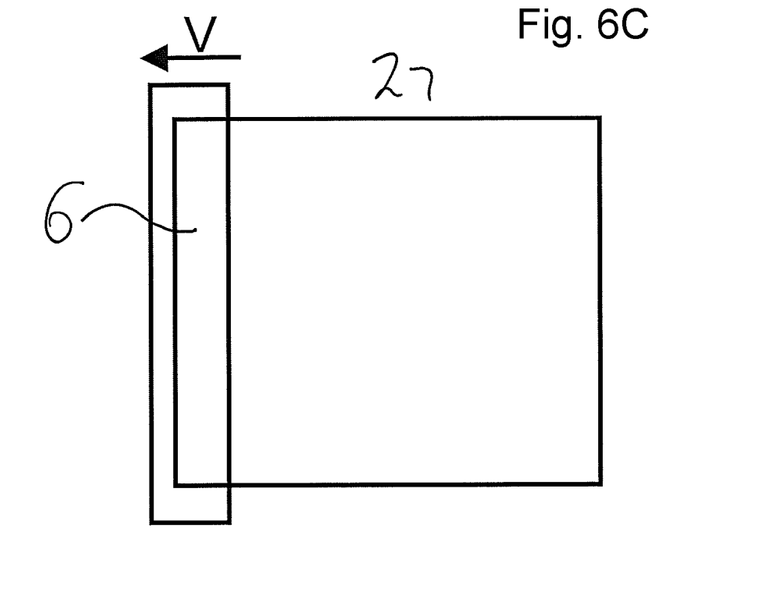

A structurally advantageously simple configuration results from the fact that, in an alternative configuration, the irradiation of the partial region illustrated in FIG. 5 is used for degradation in a first partial region, situated on the left in FIGS. 6A-6C, and for regeneration in a second partial region, situated on the right:

This makes use of the circumstance that the solar cell, proceeding from a starting temperature, heats up as a result of being subjected to radiation during the relative displacement of the region in accordance with the direction V with respect to the silicon solar cell. Process parameters can thus be chosen such that a temperature profile as illustrated schematically below FIG. 5 results within the region 6 in FIG. 5:

In this schematic, qualitative illustration, the location x is plotted against the temperature T of the solar cell. Since the region 6 is displaced from right to left in the illustration in accordance with FIG. 5 and, in this exemplary embodiment, the solar cell initially has a low temperature (for example approximately room temperature, in particular approximately 20° C.), the solar cell is heated due to being subjected to radiation. The parameters are chosen, then, in such a way that a limit temperature $T_G$ is exceeded in a boundary region $X_G$, such that substantially a degeneration takes place below said limit temperature and substantially or increasingly a regeneration takes place above said limit temperature. As a result, degradation and regeneration can likewise be carried out in two successive, separate process steps, wherein the boundary Xg between degeneration and regeneration is likewise displaced with the displacement of the partial region relative to the silicon solar cell, such that a complete regenerated solar cell results after the complete displacement of the partial region over the entire solar cell. This variant enables a structurally simple configuration since, in particular, it is necessary to use just one radiation source and a spatially compact set-up is furthermore ensured. In return, however, it is necessary to accurately adjust and comply with the process parameters. In one advantageous development, the solar cell is cooled in the region lying to the left of the boundary $X_G$ in accordance with FIG. 5, in particular is subjected to a cooling gas blown at it, in order to bring about the temperature difference in the degeneration region 6.

In method variants in which, separately, firstly the solar cell is completely degraded and then the solar cell is completely regenerated, a greater robustness and insusceptibility to faults vis-à-vis fluctuations in the process parameters are typically ensured.

FIGS. 6A-6C illustrate one exemplary embodiment of the degradation step, in which, as also described with regard to FIG. 5, a degradation region 6, in which the solar cell is subjected to degradation radiation, is moved in accordance with a direction V relative to the silicon solar cell, such that the entire surface of the silicon solar cell is subjected to degradation radiation as a result. Here, too, in order to take account of the deviating thermal behavior of the edge regions of the solar cell, firstly in the state illustrated in FIG. 6A, in which the degradation region covers a first edge, situated on the right, of the solar cell 2, the solar cell is subjected to degradation radiation with a fine initial intensity increased in this initial region. This compensates for the fact that, in said initial region, the rest of the solar cell typically still has a lower temperature and can therefore be subjected to a higher intensity in order to attain a desired temperature range.

In a central region, since the degradation region is at a distance $X_1$, in particular a distance of approximately 1 cm, from the edge situated on the right and thus the initial region, the solar cell is subjected to degradation radiation with a medium intensity, lower than the initial intensity. This is illustrated in FIG. 6B.

At the end of the degradation step, as illustrated in FIG. 6C, when the degradation region 6 covers the opposite edge, situated on the left in FIG. 6C, of the solar cell, the solar cell is subjected to degradation radiation with an end intensity, lower than the initial intensity and lower than the medium intensity.

A particularly high consistency of the temperature of the solar cell can be achieved as a result. Such a method can likewise be employed in the regeneration step. Since the temperature sensitivity is typically higher in the regeneration step than in the degradation step, it is particularly advantageous to employ the configuration as described above in the regeneration step.

The invention claimed is:

1. A method for stabilizing a photovoltaic silicon solar cell, comprising:
   in a regeneration step:
      injecting charge carriers in a semiconductor substrate of the solar cell by subjecting the solar cell to radiation, which is at least 50° C., and in a degradation step carried out before the regeneration step:
      converting material regions of the solar cell in an annealed state into a degraded state by subjecting the solar cell to radiation having a radiation intensity of at least 5,000 W/m$^2$ and at a same time as actively cooling the solar cell; and
   the regeneration step is carried out at a higher temperature of the solar cell than the degradation step.

2. The method as claimed in claim 1, wherein in the degradation step, subjecting the solar cell to laser radiation having an irradiation intensity of at least 10,000 W/m$^2$ and at the same time the solar cell is actively cooled.

3. The method as claimed in claim 1, wherein in the degradation step, cooling the solar cell to a temperature of less than 100° C.

4. The method as claimed in claim 1, further comprising carrying out the degradation step for a time duration in the range of 0.1 s to 10 s.

5. The method as claimed in claim 1, further comprising in the regeneration step, actively cooling the solar cell at a same time as injecting charge carriers in the solar cell.

6. The method as claimed in claim 5, further comprising at least one of in the regeneration step, cooling the solar cell to a temperature in the range of 90° C. to 500° C., or carrying out the regeneration step for a regeneration duration T of less than 3 s.

7. The method as claimed in claim 1, further comprising measuring a temperature of the solar cell, and selecting at least one of an irradiation intensity or an active cooling such that the temperature of the solar cell does not exceed a predefined maximum temperature.

8. The method as claimed in claim 1, further comprising in the degradation step, irradiating the solar cell in a degradation region that covers only a partial region of a surface of the solar cell.

9. The method as claimed in claim 8, further moving the degradation region relative to the solar cell, or irradiating the solar cell progressively in a plurality of spatially different degradation regions.

10. The method as claimed in claim 8, wherein in the degradation step the irradiation is carried out in a degradation region extending at least over a width of the solar cell, and at edges of the solar cell the irradiation is carried out with a lower edge intensity, relative to a central-region intensity with which regions at a distance from the edges are irradiated.

11. The method as claimed in claim 1, wherein during the regeneration step the solar cell is actively cooled to a temperature of less than 250° C. and the solar cell is subjected to a radiation intensity of at least 10,000 W/m², and a total process duration of degradation step and regeneration step is less than 50 s.

12. The method as claimed in claim 1, wherein during the regeneration step the solar cell is actively cooled to a temperature in the range of 250° C. to 400° C. and the solar cell is subjected to a radiation intensity of at least 10,000 W/m², and a total process duration of degradation step and regeneration step is less than 50 s.

13. The method as claimed in claim 9, wherein in an initial region, in which the degradation region covers a first edge of the solar cell, the irradiation is carried out with an initial intensity, and in an end region, in which the degradation region, after the irradiation of the initial region, covers a second edge opposite to the first edge of the solar cell, the irradiation is carried out with an end intensity lower than the initial intensity, and in a central region, in which the degradation region, after the irradiation of the initial region and before the irradiation of the end region, covers a central region of the solar cell, the irradiation is carried out with a medium intensity, which is less than the initial intensity and greater than the end intensity.

* * * * *